United States Patent [19]

Mitome et al.

[11] Patent Number: 5,695,897
[45] Date of Patent: Dec. 9, 1997

[54] ALIGNMENT METHOD AND SEMICONDUCTOR EXPOSURE METHOD

[75] Inventors: Noriyuki Mitome, Tochigi-ken; Eiichi Murakami, Utsunomiya; Shigeyuki Uzawa, Tokyo, all of Japan

[73] Assignee: Canon Kabushiki Kaisha, Tokyo, Japan

[21] Appl. No.: 564,615

[22] Filed: Nov. 29, 1995

[30] Foreign Application Priority Data

Nov. 29, 1994 [JP] Japan .................. 6-294812
Dec. 15, 1994 [JP] Japan .................. 6-332884

[51] Int. Cl.⁶ .................................................. G03F 9/00
[52] U.S. Cl. ...................................................... 430/22
[58] Field of Search .......................... 430/22, 5; 355/53; 356/401, 400

[56] References Cited

U.S. PATENT DOCUMENTS

| | | |
|---|---|---|
| 4,734,746 | 3/1988 | Ushida et al. ............ 355/27 |
| 4,795,911 | 1/1989 | Kohno et al. . |
| 4,886,975 | 12/1989 | Murakami et al. . |
| 4,901,109 | 2/1990 | Mitome et al. . |
| 5,008,703 | 4/1991 | Kawakami et al. . |
| 5,017,798 | 5/1991 | Murakami et al. . |
| 5,063,582 | 11/1991 | Mori et al. . |
| 5,112,133 | 5/1992 | Kurosawa et al. . |
| 5,125,014 | 6/1992 | Watanabe et al. . |
| 5,128,975 | 7/1992 | Iwamoto et al. . |
| 5,131,022 | 7/1992 | Terashima et al. . |
| 5,138,643 | 8/1992 | Sakamoto et al. . |
| 5,142,156 | 8/1992 | Ozawa et al. . |
| 5,150,391 | 9/1992 | Ebinuma et al. . |
| 5,155,523 | 10/1992 | Hara et al. . |
| 5,172,402 | 12/1992 | Mizusawa et al. . |
| 5,172,403 | 12/1992 | Tanaka et al. . |
| 5,182,615 | 1/1993 | Kurosawa et al. . |
| 5,231,291 | 7/1993 | Amemiya et al. . |
| 5,250,983 | 10/1993 | Yamamura ............... 355/125 |
| 5,285,488 | 2/1994 | Watanabe et al. . |
| 5,317,615 | 5/1994 | Ebinuma et al. . |
| 5,377,251 | 12/1994 | Mizusawa et al. . |
| 5,444,538 | 8/1995 | Pellegrini ................. 356/401 |
| 5,448,333 | 9/1995 | Iwamoto et al. ............ 355/53 |

FOREIGN PATENT DOCUMENTS

440470  8/1991  European Pat. Off. .

OTHER PUBLICATIONS

"Lens Design Method", Yoshiya Matsui, published by Kyoritsu Shuppan Japan, 1972.
Patent Abstract of Japan, vol. 18, No. 545, published Jul. 15, 1994; English Abstract of Japanese Patent No. 6-196384.

*Primary Examiner*—S. Rosasco
*Attorney, Agent, or Firm*—Fitzpatrick, Cella, Harper & Scinto

[57] ABSTRACT

An alignment method or an exposure method in an exposure process in which a first stepper having a first reduction magnification and a second stepper having a second reduction magnification, higher than the first reduction magnification, are used in combination. For a global alignment through the first stepper on the basis of alignment marks having been defined through the second stepper in relation to shots thereof, in every shot of the first stepper the position of such alignment mark or marks to be measured is made variable with respect to the shot center.

10 Claims, 11 Drawing Sheets

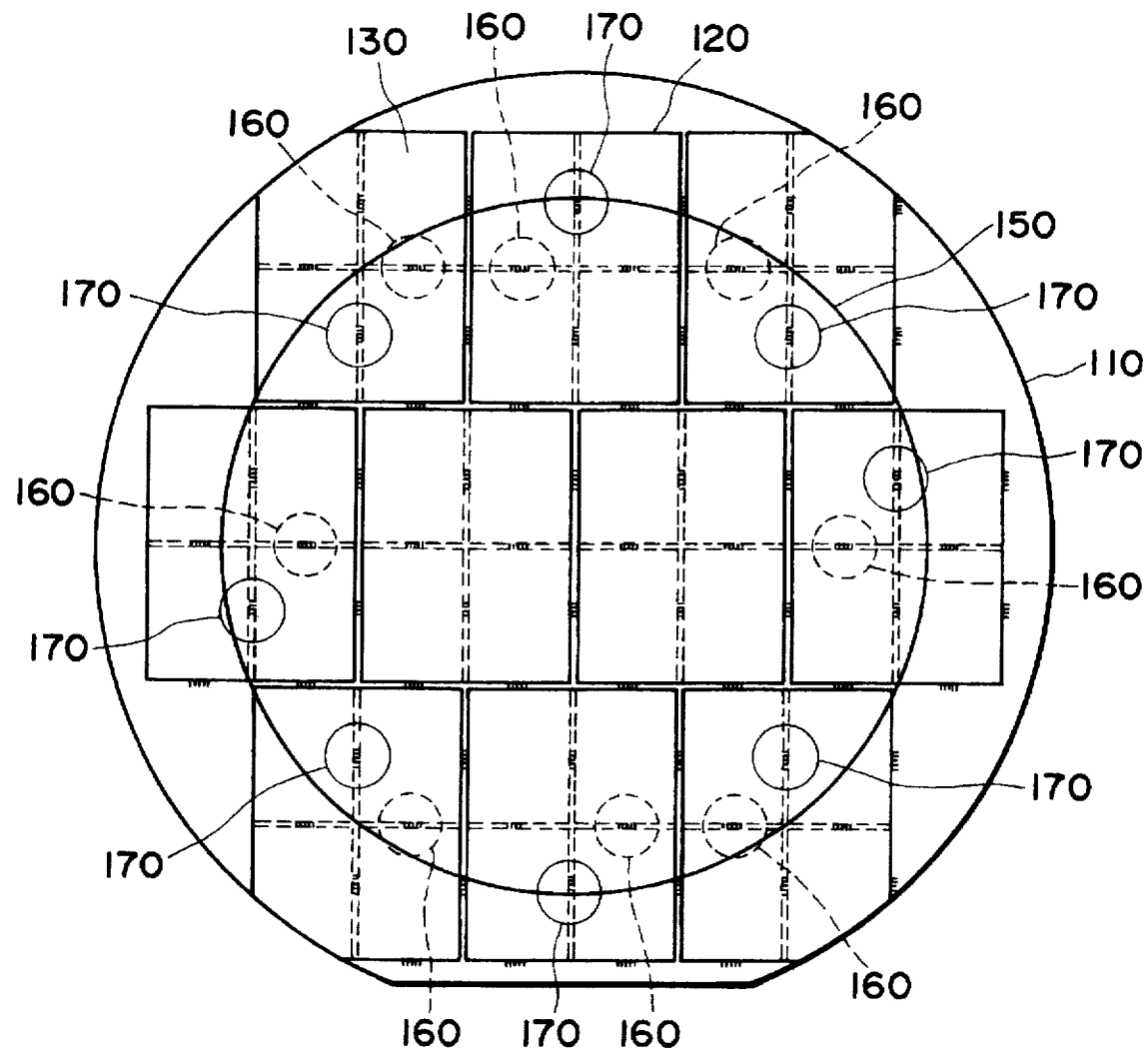
F I G. 3
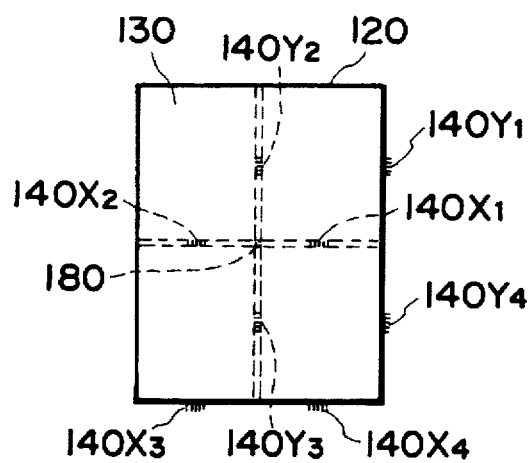
F I G. 4

ALIGNMENT METHOD AND SEMICONDUCTOR EXPOSURE METHOD

FIELD OF THE INVENTION AND RELATED ART

This invention relates to an alignment method for super-position exposure to be used in an exposure process (mix-and-match exposure process) in which exposure apparatuses having different reduction magnifications are used in combination. According to another aspect, the invention is concerned with a semiconductor exposure method using a step-and-repeat type or step-and-scan type exposure apparatus, for performing high precision exposure in semiconductor device manufacturing processes. According a further aspect, the invention is concerned with a reticle to be used in such an alignment process or semiconductor exposure process.

In some of exposure processes in the manufacture of semiconductor devices, an exposure apparatus of the step-and-repeat type, having a reduction magnification of 1:10 to 1:5, (to be called "higher-magnification stepper") and an exposure apparatus of a mirror projection type or a proximity type of unit magnification, are used in combination (this is called "mix-and-match" process). This is because: A unit-magnification exposure apparatus provides a larger throughput than that of a higher-magnification stepper. In consideration of this, among semiconductor processes of more than ten, the unit-magnification exposure apparatus is used in those processes in which lower resolution or lower alignment precision is required; whereas the higher-magnification stepper is used in those processes in which higher resolution or precision is required. Such mix-and-match procedure is effective to reduce the semiconductor manufacturing cost.

A recently proposed exposure apparatus is a stepper (to be called "lower-magnification stepper) having a reduction magnification of 1:2 to 1:4 and a transfer image size two times larger (four times larger, in terms of area) than that of a higher-magnification stepper.

Now, an exposure process in which a higher-magnification stepper and a lower-magnification stepper are used in combination, will be explained with reference to some of the drawings.

FIG. 19 illustrate how to perform global alignment measurement (alignment measurement based on a few selected sample points on a wafer) in a low-magnification stepper, in the mix-and-match procedure. In this case, as seen from FIG. 19, those zones on a wafer 410, corresponding to four shots 430 exposed by a higher-magnification stepper, are to be exposed by a lower-magnification stepper as one shot 420. FIG. 20 illustrates an extracted portion of FIG. 19, corresponding to one shot 420 to be exposed by the lower-magnification stepper. Denoted at 440X and 440Y are an X-direction measurement alignment mark and a Y-direction measurement alignment mark, respectively, which have been formed during one shot (exposure) by the higher-magnification stepper.

In a case of a global alignment process in which eight peripheral shots of FIG. 19 are to be measured, the positions of alignment marks to be measured are fixed with respect to the center of the shot to be exposed by the lower-magnification stepper, as depicted by broken-line circles 460 (marks to be used in X-direction measurement) and solid-line circles 470 (marks to be used in Y-direction measurement). This may cause the need to detect a mark or marks located outside an imaginary circle 450 (having the same center as of the wafer) which depicts a range in which the effect of the warping of the wafer or the non-uniformness of the resist coating of the wafer is small, or it may end in an undesirable result of a reduced number of measurements if such outside marks are not measured.

On the other hand, generally a reticle R to be used in a stepper has plural circuit patterns SA–SD (FIG. 21) corresponding to plural chips, which are to be exposed by one shot. Also, there are alignment marks as and bs for position detection with respect to X and Y directions, which are placed in peripheral portions (scribe portions) around the exposure zone of one shot. As regards the wafer alignment method, from the viewpoint of the balance of productivity and alignment precision, a global alignment method may be used wherein the positions of all the shots of the wafer are determined on the basis of the measurements of alignment marks as and bs of a few shots (sample shots) of the wafer and, in accordance with the thus determined positions, the position of each shot of the wafer is adjusted.

SUMMARY OF THE INVENTION

In such mix-and-match procedure as described above in which a higher-magnification stepper and a lower-magnification stepper are used in combination, since the lower-magnification stepper has a larger picture field size per one shot, the number of exposures (exposure operations) per one wafer is smaller than that performed by the higher-magnification stepper. This raises a problem that, when alignment measurement is performed by selecting a few sample points on a wafer, the number of sample points becomes smaller which may lead to decreased alignment precision. Also, a large span can not be defined between alignment marks, and the alignment precision may be degraded.

Further, since the positions of alignment marks to be measured are fixed with respect to the center of the shot to be exposed by the lower-magnification stepper, there is a possibility that some alignment marks are located at a peripheral portion of the wafer, this being undesirable from the point of view of higher sensitivity to warping of the wafer or to a change in film thickness of a resist. Thus, the alignment precision may be degraded.

In this respect, it is an object of the present invention to provide an alignment method by which an accurate alignment process is assured without degradation of alignment precision even if the number of sample points is small or if the span of alignment marks is not large.

In addition, the exposure field size of each shot of steppers has become larger. As a result of this, the number of step-and-repeat motions of a wafer (generally corresponding to the number of shots) has become very small. This is a factor for restricting the selection of sample shots and for causing deterioration of the alignment precision.

FIG. 22 shows an exposure layout in such case. The illustrated figure is an example wherein a reticle R shown in FIG. 21 is used in combination with a wafer 41 of 8-inch diameter and with an exposure size of 50 mm square, and the layout and positions of alignment marks as and bs of each shot are depicted. In this example, as illustrated, only sixteen (16) shots are defined on the wafer 41. Further, with regard to those shots which are at an outside peripheral portion of the wafer, there is a high possibility of non-uniformness in film thickness of a resist or distortion of the wafer. In consideration of them, as the sample shots for global alignment, only four shots 1s–4s about the center may be selected. The span between the alignment marks is very short i.e., about 50 mm, and the number of the sample shots is only four. As a result, the precision of measured values in relation to the rotation or magnification of the shot layout of the wafer would be degraded.

Shots 2s, 3s, 5s and 6s may be selected as the sample shots in a attempt to obtain a long span of alignment marks. In that case, however, the mark positions are not symmetrical with respect to the wafer center, and this undesirably creates an error factor. Further, in different shots the mark position may be made different. In that case, however, a measurement error may occur due to distortion of an exposure optical system, for example. Such error directly leads to degradation of the alignment precision, and it is not desirable too.

Another object of the present invention is provide a semiconductor exposure method and/or a reticle by which accurate alignment is assured.

In accordance with an aspect of the present invention, there is provided an alignment method in an exposure process in which a first stepper having a first reduction magnification and a second stepper having a second reduction magnification, higher than the first reduction magnification, are used in combination, characterized in that: for a global alignment through the first stepper on the basis of alignment marks having been defined through the second stepper in relation to shots thereof, in every shot of the first stepper the position of such alignment mark or marks to be measured is made variable with respect to the shot center.

In one preferred form of this aspect of the present invention, in the global alignment through the first stepper, the same alignment mark to be used in global alignment through the second stepper is measured.

In accordance with another aspect of the present invention, there is provided an alignment method in an exposure process in which a first stepper having a first reduction magnification and a second stepper having a second reduction magnification, higher than the first reduction magnification, are used in combination, characterized in that: for global alignment through the second stepper on the basis of alignment marks having been defined through the first stepper, in every shot of the second stepper the position of such alignment mark or marks to be measured is made variable with respect to the shot center.

In one preferred form of this aspect of the present invention, alignment marks defined through the first stepper are placed symmetrically with respect to the shot center of the first stepper, and wherein the global alignment through the second stepper uses the thus symmetrically placed alignment marks the number of which is even for different shots.

In another preferred form of this aspect of the present invention, alignment marks of a shot of the first stepper are placed symmetrically in a direction of measurement and with respect to the shot center, and wherein the number of alignment marks to be measured in relation to the symmetrical pair is even.

In accordance with a further aspect of the present invention, there is provided an alignment method in an exposure process in which alignment marks are formed on a substrate and in which a first stepper having a first reduction magnification and a second stepper having a second reduction magnification, higher than the first reduction magnification, are used in combination, characterized in that: offsets are set on the basis of image heights of alignment marks of a shot, and wherein the set offset are reflected in accordance with the number of alignment marks at each image height as measured.

Briefly, in accordance with the present invention, a first stepper having a first reduction magnification and a second stepper having a second reduction magnification, higher than the first reduction magnification, may be used in combination, and, for global alignment through the first stepper on the basis of alignment marks having been defined through the second stepper in relation to shots thereof, in every shot of the first stepper, the position of such alignment mark or marks to be measured may be made variable with respect to the shot center. This allows that an alignment mark or marks to be measured are located at the position where the effect of wafer warp or a change in resist film thickness is small.

When global alignment is performed through the first stepper, the same alignment mark to be used in global alignment through the second stepper may be measured. This provides a larger latitude for setting the alignment mark position, and the alignment mark span can be made large. Thus, it is effective to prevent degradation of alignment precision. Also, the number of shots to be measured in the global alignment can be made larger than the number of shots to be exposed by the first stepper having a lower reduction magnification, and thus a reduction in number of sample shots can be prevented.

The alignment marks defined through the first stepper may be placed symmetrically with respect to the shot center of the first stepper, or they may be made symmetrically with respect to the shot center only in relation to the measurement direction. Also, the global alignment through the second stepper may use the thus symmetrically placed alignment marks the number of which may be even for different shots. This is effective to avoid the effect of aberration of distortion.

Offsets may be set on the basis of image heights of alignment marks of a shot, and the set offset may be reflected in accordance with the number of alignment marks at each image height as measured. In that case, deviation of each alignment mark from the image height may be calculated, and the result may be taken as an offset. This is effective to reduce the effect of aberration of distortion.

In accordance with a further aspect of the present invention, there is provided a reticle to be used in a semiconductor exposure apparatus and having a pattern of plural chips to be exposed in relation to a single shot, characterized in that: the reticle is provided with an alignment mark in relation to each of the chips.

In accordance with a still further aspect of the present invention, there is provided an exposure method for performing sequential exposure of different shot regions of a substrate, comprising the steps of: performing an exposure process on the substrate by use of a reticle having plural chip patterns, to be exposed in a single shot, and alignment marks provided in relation to the chip patterns, respectively; and performing an alignment process on the substrate by using an alignment mark in each chip as transferred to the substrate through the exposure process.

In one preferred form of this aspect of the present invention, in each shot on the substrate, a position measurement error produced in dependence upon the position of an alignment mark with respect to the shot center is measured and wherein a measured value of each alignment mark position with respect to the shot center is corrected on the basis of the error measurement.

In accordance with a yet further aspect of the present invention, there is provided an exposure method for performing sequential exposure of different shot regions of a substrate, comprising the steps of: performing an exposure process on the substrate by use of a reticle having plural chip patterns, to be exposed in a single shot, and alignment marks provided in relation to the chip patterns, respectively; and measuring at least one of a chip magnification error and a chip rotation, by using an alignment mark in each chip as transferred to the substrate through the exposure process.

In one preferred form of this aspect of the present invention, each chip of the reticle is provided with two opposed alignment marks for X-direction detection and two opposed alignment marks for Y-direction detection, which are disposed around that chip.

Briefly, according to these aspects of the present invention, even in a case of large field size exposure in which one shot zone is large because each chip has an alignment mark pattern or patterns, there is a large latitude of alignment mark selection. Therefore, as compared with conventional processes wherein an alignment mark or marks are provided only in relation to the shot, it is possible to provide a larger distance between alignment marks to be measured for the global alignment. Also, selection of such alignment marks having higher symmetry with respect to the wafer center, is assured. Thus, enhanced alignment precision is provided. In that case, a position measurement error may occur, depending on the position of the alignment mark in the shot zone with respect to the shot center. Thus, such error may preferably be memorized beforehand and, on the basis of this, the measured value of the alignment mark position with respect to the shot center may be corrected. This assures further enhancement of the alignment precision.

Magnification error of a shot or a chip rotation in that shot may be measured by using the position of alignment marks in plural chips of that shot. By correcting such error or rotation, more correct exposure is assured.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIG. 3 is a schematic view for explaining global alignment measurement in a higher-magnification stepper, in an alignment method according to an embodiment of the present invention.

FIG. 4 illustrates an extracted portion of FIG. 3, corresponding to a single shot of a lower-magnification stepper.

DESCRIPTION OF THE PREFERRED EMBODIMENTS

Figure 18:
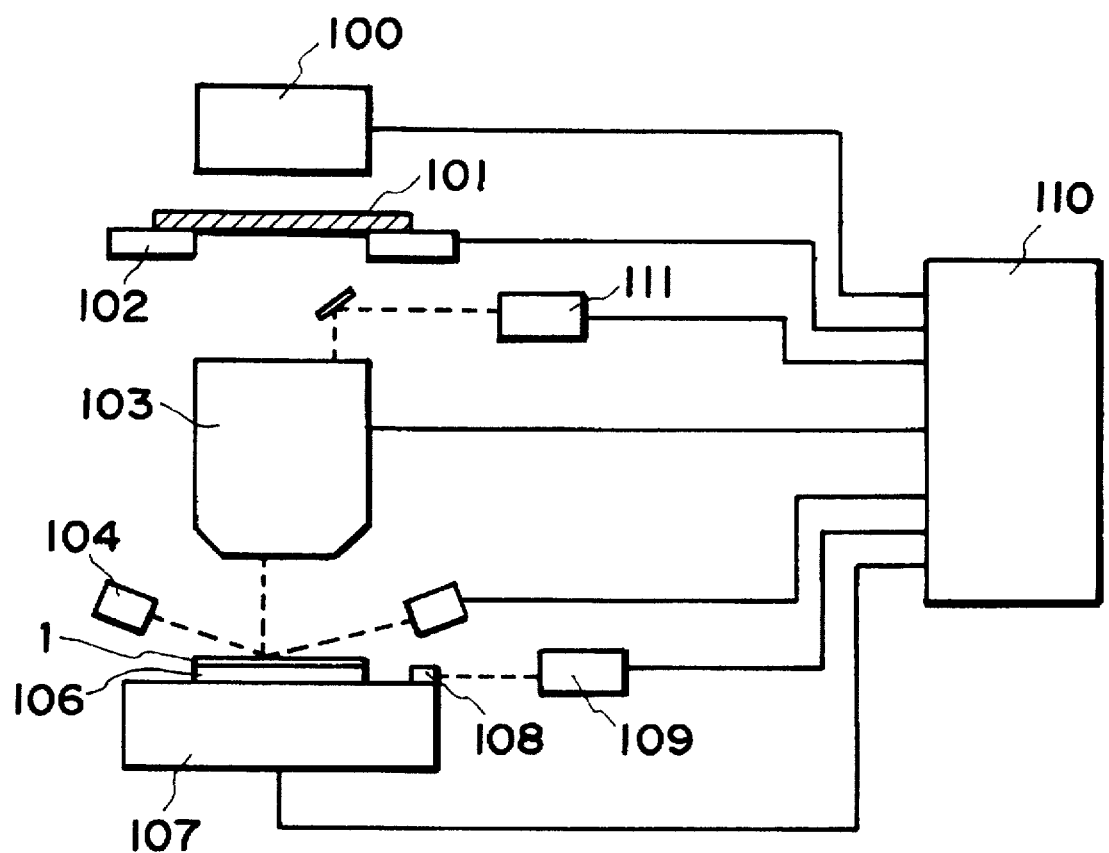
FIG. 18 is a schematic view of a semiconductor device manufacturing projection exposure apparatus to which the present invention is applicable.
Figure 19:
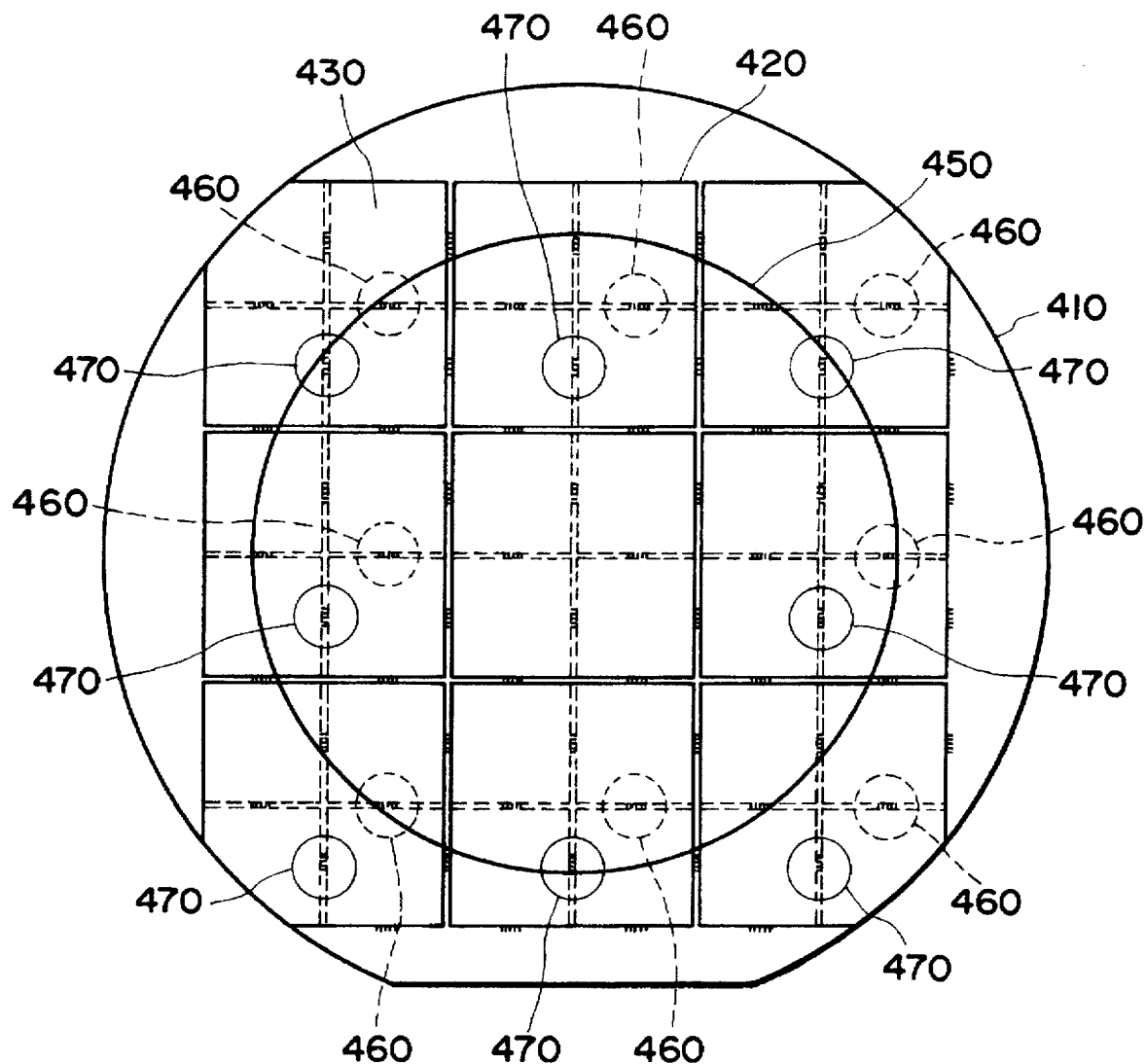
FIG. 19 is a schematic view for explaining global alignment measurement through a lower-magnification stepper, in a conventional mix-and-match procedure.
Figure 20:
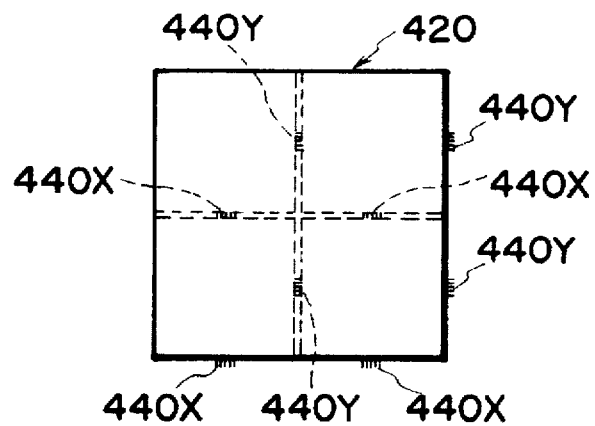
FIG. 20 illustrates an extracted portion of FIG. 19, corresponding to a single shot of the lower-magnification stepper.
Figure 21:
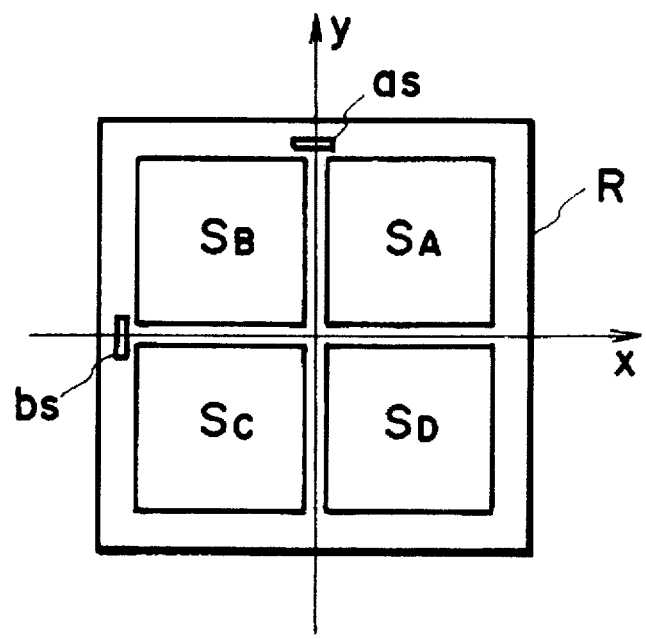
FIG. 21 is a plan view of a reticle of known type.
Figure 22:
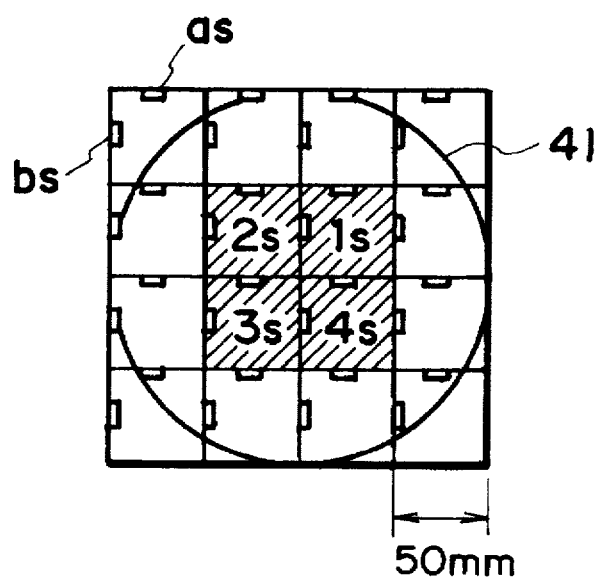
FIG. 22 is a schematic view for explaining the layout in a case where the reticle of FIG. 21 is used with a stepper for exposure of a wafer.

First, the structure of a step-and-repeat type (or step-and-scan type) projection exposure apparatus, called a stepper, to which the present invention is applicable, will be explained with reference to FIG. 18. Denoted in the drawing at 100 is an illumination optical system which produces exposure light with which a pattern (including plural chip patterns) formed on a reticle 101 is to be projected and lithographically transferred to a photosensitive resist layer, applied to a wafer 1. Denoted at 102 is a reticle stage for holding the reticle 101. In response to projection of exposure light from the illumination optical system 100 to the reticle 101 as held by the reticle stage 102, the pattern of the reticle 101 is projected, through a reduction projection lens 103 and at a reduced scale, upon a wafer 1 which is held by a wafer chuck 106. In this specification, the term "higher-magnification stepper" refers to a stepper with a projection lens 103 having a projection magnification of about 1:9 to 1:10, while the term "lower-magnification stepper" refers to a stepper with a projection lens 103 having a unit projection magnification 1:1 or a projection magnification of about 1:2 to 1:4.

Denoted at 104 is an autofocusing system of known structure. It serves to project a light beam onto the surface of the wafer 1, and to detect the position of the wafer surface in the direction of optical axis (Z axis) and with respect to the focusing plane of the projection lens 103 by photoelectrically detecting reflected light from the wafer surface. On the basis of detection by the autofocusing system, the wafer chuck 106 is moved by a driving mechanism (not shown) in the optical axis direction of the projection lens 103 such that the surface of the wafer 1 is placed at the focusing plane of the projection lens 103. Denoted at 107 is a wafer stage for moving the wafer 1, held by the wafer chuck 106, along a plane (X-Y plane) perpendicular to the optical axis direction of the projection lens 103. Particularly, it serves to cause step-and-repeat motion of the wafer 1 in the process of sequential exposures of zones of the wafer 1.

Denoted at 108 is a mirror which is movable together with the wafer stage 107 along the X-Y plane, and denoted at 109 is a laser interferometer type distance measuring system of known structure, for measuring the position of the wafer stage 107 upon the X-Y plane, in combination with the mirror 108 Denoted at 110 is a console unit which serves to control the projection exposure apparatus as a whole. Denoted at 111 is an alignment detecting system of known structure, for detecting an alignment mark or marks, formed on the wafer 1, through the projection lens 103 and for measuring the position of the wafer 1 with respect to the X-Y plane. The console unit 110 functions on one hand to control the projection exposure apparatus as a whole and, on the other hand, it serves to determine and select sample shots (alignment marks to be measured), to be described later. In the following description, unless mentioned otherwise specifically, determinations are performed under the control by a central processing unit (CPU) of the console unit 1.

Figure 1:
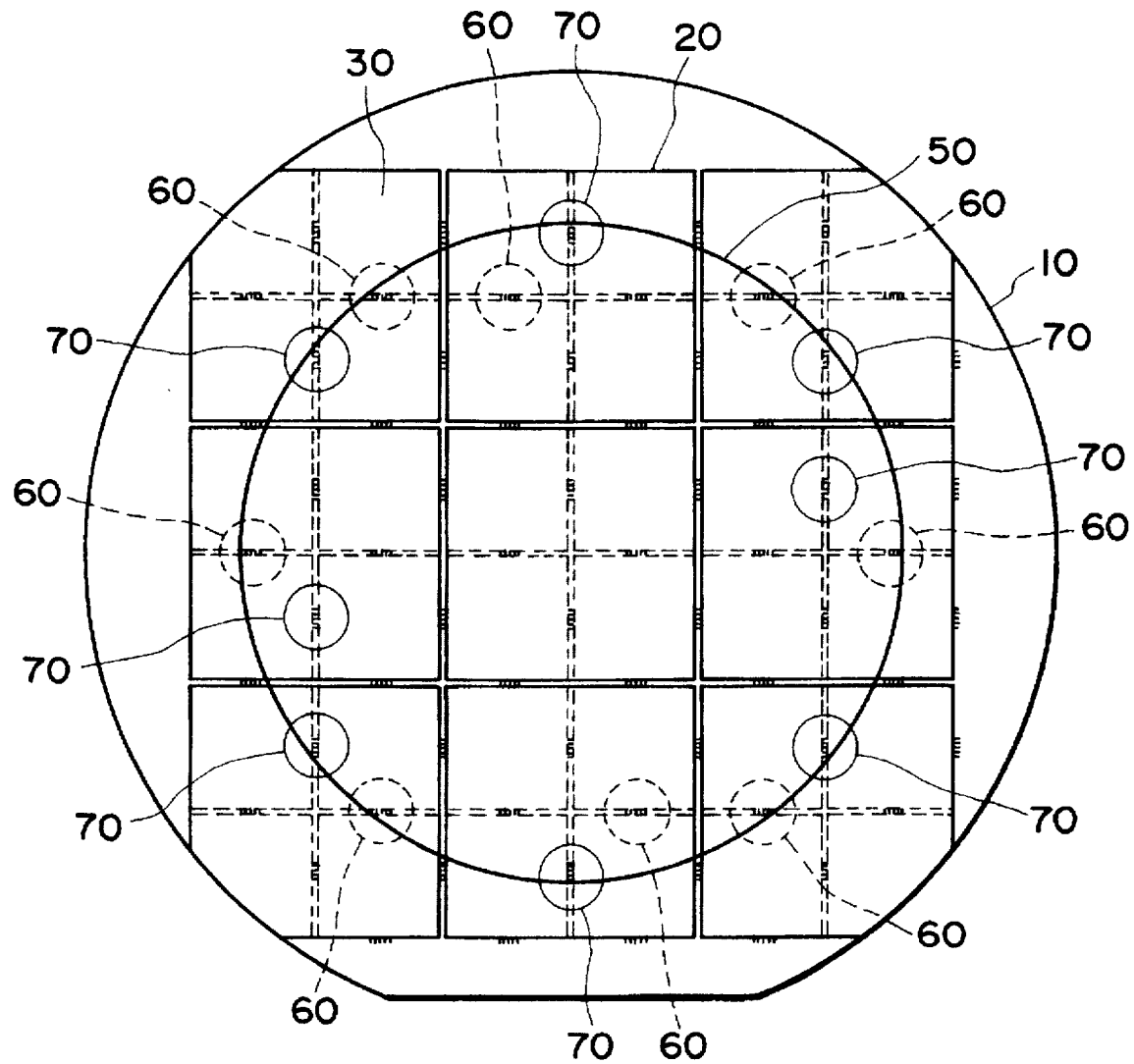
FIG. 1 is a schematic view for explaining global alignment measurement in a lower-magnification stepper, in an alignment method according to an embodiment of the present invention.
Figure 2:
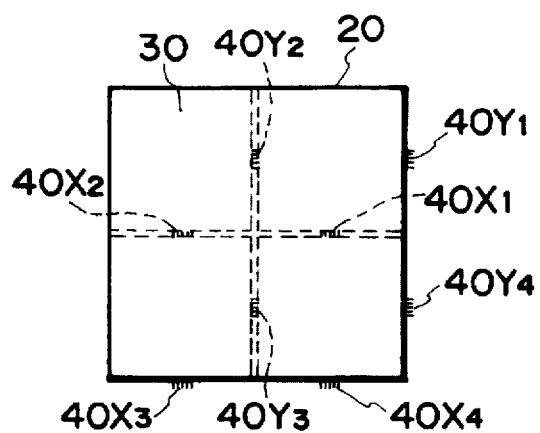
FIG. 2 illustrates an extracted portion of FIG. 1, corresponding to a single shot of the lower-magnification stepper.

FIG. 1 is a schematic view for explaining global alignment measurement process with a lower-magnification stepper, in an embodiment of alignment method of the present invention. As seen in FIG. 1, those zones, corresponding to four shots 30 as exposed by a higher-magnification stepper having a reduction magnification of about 1:4 to 1:10, are to be exposed by a single shot 20 of a lower-magnification stepper having a reduction magnification 1:1 to 1:4. FIG. 2 corresponds to an extracted portion of FIG. 1, corresponding to one shot 20 of the lower-magnification stepper.

In this embodiment, for the global alignment procedure through the lower-magnification stepper, out of the alignment marks $40X_1$–$40X_4$ and $40Y_1$–$40Y_4$ having been formed in the exposure processes by the higher-magnification stepper in relation to the shots 30 on the wafer 10, one alignment mark is selected in relation to the X direction and one alignment mark is selected in relation to the Y direction, the selection being made in relation to every shot 20 to be exposed by the lower-magnification stepper, such that the positions of the marks to be used as the subject of measurement can be set variable with respect to the center of the shot 20

More specifically, the positions of the marks to be used as the subject of measurement are indicated in FIG. 1 by broken-line circles 60 (marks to be used in X-direction measurement) and solid-line circles 70 (marks to be used in Y-direction measurement). As seen in the drawing, those marks which are inside an imaginary circle 50, depicting a range in which there is a small effect of warping of the wafer 10 or of non-uniformness of the resist coating, and which are located at an outside portion within that range, are selected. After the selection, the wafer stage 107 is moved along the X-Y plane in accordance with signals from the console unit 110, so that the selected alignment marks are placed sequentially at the position whereat the mark is detected by the alignment detecting system 111. Thus, measurements of global alignment procedure start.

This ensures minimization of the effect of non-uniformness of the resist coating or of wafer warp particularly at the peripheral portion of the wafer. Additionally, it is possible to define a maximum span of those alignment marks selected as the subject of measurement. As a result, good alignment precision is obtainable.

FIG. 3 is a schematic view for explaining global alignment measurement process with a higher-magnification stepper, in an embodiment of an alignment method of the present invention. FIG. 4 corresponds to an extracted portion of FIG. 3, corresponding to one shot 20 of a lower-magnification stepper. In this embodiment, as compared with the preceding embodiment, the shot layout for the lower-magnification stepper is such that lateral rows have a mutual shift by a half pitch. In this example, the global alignment procedure through the higher-magnification stepper is to be performed by using alignment marks having been exposed by the lower-magnification stepper in relation to the shots thereof.

In this embodiment, alignment marks to be exposed by the lower-magnification stepper are placed symmetrically with respect to the optical axis center 180 (shot center) of the reduction projection lens 103 (FIG. 18), as that shot in which those alignment marks are to be exposed is disposed at the exposure position. Additionally, as regards the alignment marks to be used in the global alignment procedure through the higher-magnification stepper, the same number of measurements is set to these marks with respect to the optical axis center 180 of the reduction projection lens 103. In FIG. 3, denoted at 110 is a wafer, and denoted at 120 is a zone corresponding to a single shot by the lower-magnification stepper. Denoted at 130 is a zone corresponding to a single shot of the higher-magnification stepper. The positions of alignment marks to be used in the global alignment procedure through the higher-magnification stepper are depicted by broken-line circles 160 (X-measurement) and solid-line circles (Y measurement).

According to "Lens Design Method" by Yoshiya Matsui, published by Kyoritsu Shuppan, Japan, 1972, the aberration of distortion is proportional to the cube of the field angle (in aberration explosion up to cubic). Namely, where the marks $140X_1$, $140X_2$, $140Y_1$ and $140Y_2$ shown in FIG. 4 are placed symmetrically with respect to the optical axis center 180 of the reduction lens 103 and where the set number of measurements (measurement times T) at each alignment mark position within every sample shot 120 is even, the effect of aberration of distortion is canceled. In this example, the number T of measurements at each alignment mark position within every sample shot 120 is "four".

Figure 6:
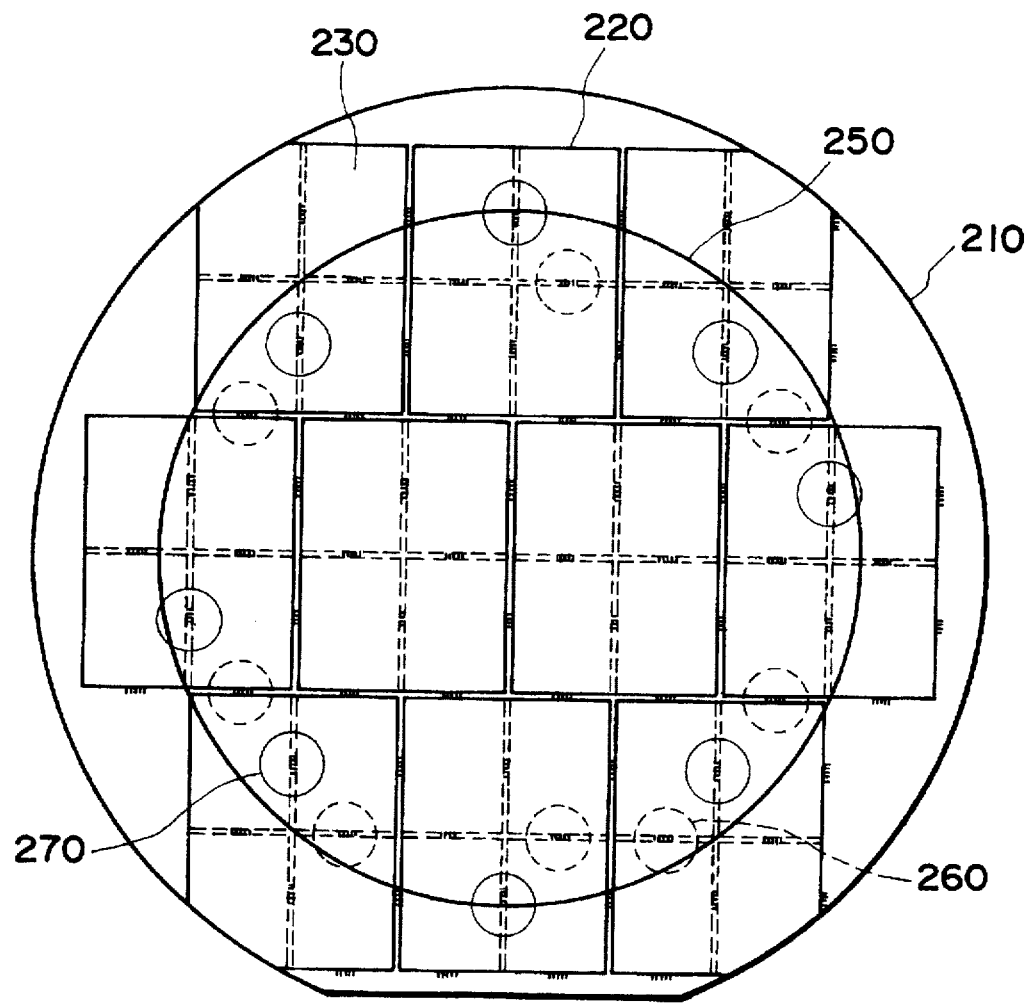
FIG. 6 is a schematic view for explaining an example, in relation to the embodiment of FIG. 3, where aberration of distortion is not taken into account.
Figure 7:
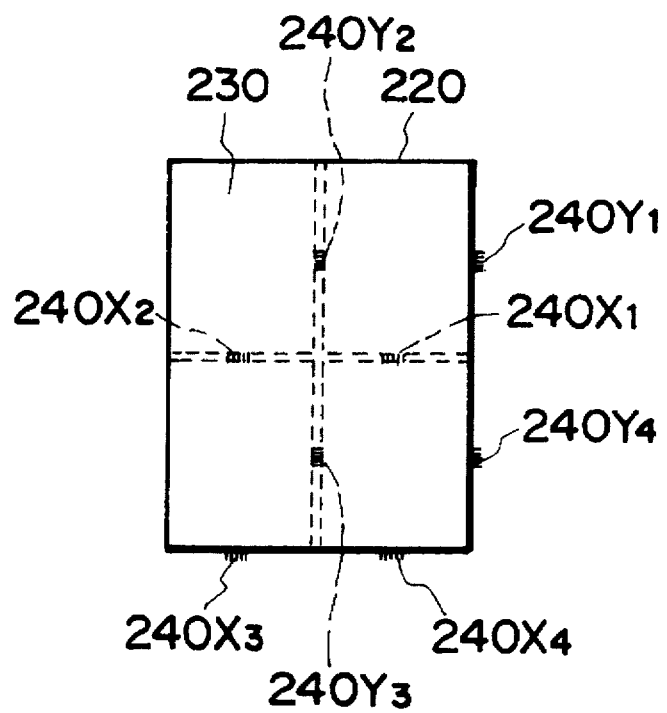
FIG. 7 illustrates an extracted portion of FIG. 6, corresponding to a single shot of a lower-magnification stepper.
Figure 8:
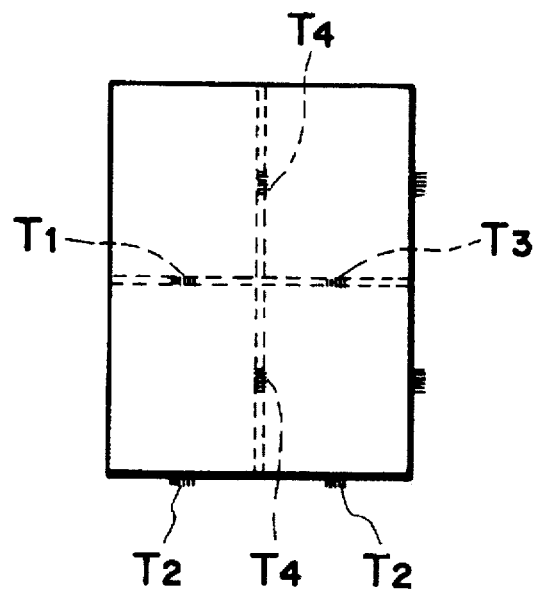
FIG. 8 is a schematic view for explaining the number of measurements (measurement times) at each measurement position in FIG. 7.

FIG. 6 corresponds to a case where aberration of distortion is not taken into account. FIG. 7 illustrates an extracted portion of FIG. 6, corresponding to a single shot by the lower-magnification stepper. FIG. 8 illustrates the number of measurements at respective measurement positions in FIG. 7.

Without taking into account the aberration of distortion, the number of measurements is not even such that, as illustrated in FIG. 8, for a mark $240X_1$ and a mark $240X_2$ the measuring operation is performed three times ($T=T_3$) and once ($T=T_1$), respectively. Thus, due to the effect of aberration of distortion, the alignment precision may decrease. For marks $240Y_2$ and $240Y_3$, the measuring operation is performed for times ($T=T_4$). For marks $240X_3$ and $240X_4$, the measuring operation is performed twice ($T=T_2$).

Figure 5:
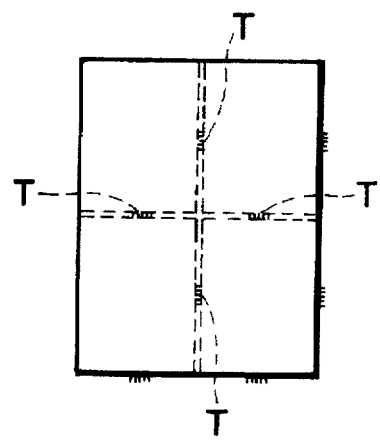
FIG. 5 is a schematic view for explaining the number of measurements (measurement times) at each measurement position in FIG. 4.

In the example of FIG. 5, the X-direction measurement and the Y-direction measurement are performed by using separate marks (to be called "X-Y split mark"). However, such a mark by which both of the X-direction and Y-direction measurements are attainable, may be used. When an X-Y split mark is used and if the number of measurements set to the mark is even, it is not a requirement that the split mark is placed exactly symmetrically with respect to the center 180 (FIG. 4) of the reduction projection lens 103. Approximate symmetry may be sufficient.

As a pair of marks 140$X_3$ and 140$X_4$ such as shown in FIG. 4, for example, those marks which are placed off the axis may be used provided that they are disposed symmetrically with respect to the direction in relation to which the measurement is to be done. Also, the aberration of distortion of the reduction projection lens may be measured beforehand, and alignment marks may be provided at those positions where the aberration of distortion can be canceled.

In a case where the positions of alignment marks on a wafer deviate due to the aberration of distortion of the reduction projection lens, the amount of deviation of each alignment mark from the image height where the mark should be may be measured so that offset information may be prepared with respect to these alignment marks. Such offset information may determined on the basis of measurement of the aberration of distortion of the reduction projection lens. Alternatively, a reference wafer may be used: That is, a global alignment procedure may be performed, for example, for a combination of alignment marks 40$X_i$ and 40$Y_j$ (i=j, i=1 to 4) and, in relation to each i or j, an alignment offset may be detected. The alignment offset may be one reflecting the times the mark is used. As regards use of the image height based alignment offset described above, it may be used not only in a case where a global alignment procedure is performed through a higher-magnification stepper by using alignment marks exposed through a lower-magnification stepper but also in a case where a global alignment procedure is performed through a lower-magnification stepper by using alignment marks exposed through a higher-magnification stepper. Also, it may be used in a case where, while alignment marks are disposed at different image heights and exposed through a lower-magnification stepper, a global alignment procedure is performed through the lower-magnification stepper by using the alignment marks at different image heights.

Figure 9:
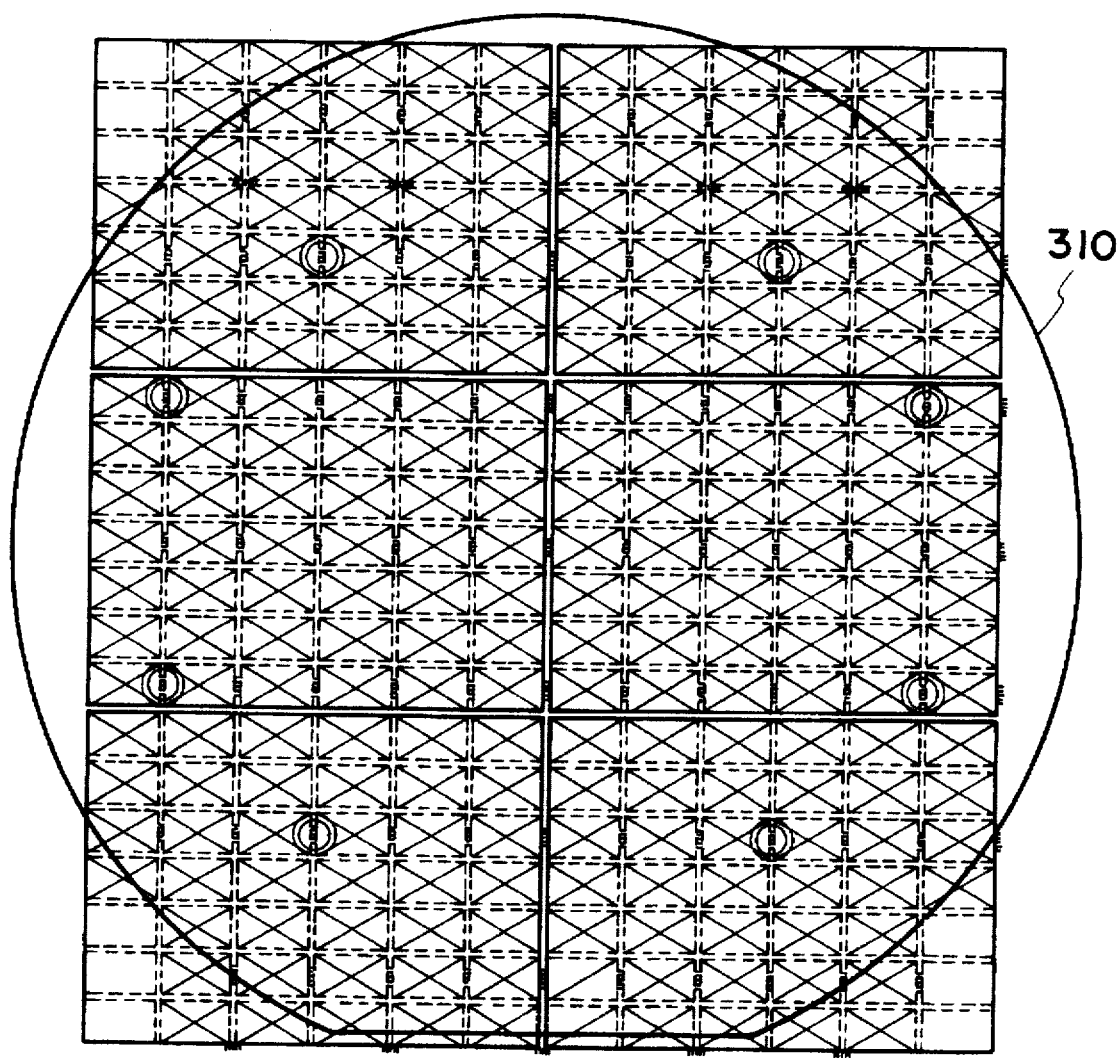
FIG. 9 is a schematic view for explaining global alignment measurement through a higher-magnification stepper, in an alignment method according to an embodiment of the present invention, particularly in a case where the size of one shot of a lower-magnification stepper is not n-times larger (n is an integer) than that of the higher-magnification stepper.
Figure 10:
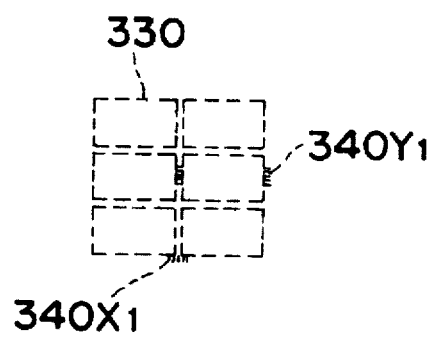
FIG. 10 illustrates an extracted portion of FIG. 9, corresponding to a single shot of the higher-magnification stepper.
Figure 11:
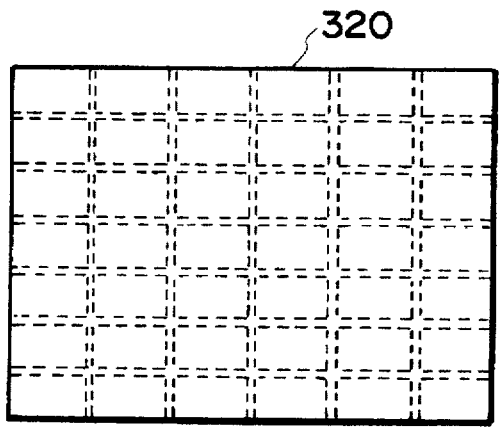
FIG. 11 illustrates an extracted portion of FIG. 9, corresponding to a single shot of the lower-magnification stepper.

FIG. 9 is a schematic view for explaining a mix-and-match procedure according to a further embodiment of the present invention, wherein global alignment measurement is to be performed through a higher-magnification stepper in a case where the size of a single shot of a lower-magnification stepper is not n-times (n is an integer) larger than that of the higher-magnification stepper. FIG. 10 shows an extracted portion of FIG. 9, corresponding to a single shot of the higher-magnification stepper. FIG. 11 shows an extracted portion of FIG. 9, corresponding to a single shot of the lower-magnification stepper.

In this embodiment, as shown in FIG. 9, a substrate layer is formed by using the higher-magnification stepper and then the alignment operation is effected through the lower-magnification stepper. In the higher-magnification stepper, as shown in FIG. 10, there are plural chips per one shot (six chips in the FIG. 10 example) and, in regard to each of X-direction and Y-direction measurements, there is one alignment mark 340$X_1$ or 340$Y_1$. Each cross denotes the shot center of the higher-magnification stepper. In a case as shown in FIG. 9 where the size of one shot of the lower-magnification stepper is not n-times larger (n is an integer) than that of the higher-magnification stepper, the layout for exposure process through the lower-magnification stepper will be such as shown in FIG. 9 wherein each shot partially overlaps some shots of the higher-magnification stepper. In the global alignment procedure to be performed prior to it, alignment marks are selected in regard to the shot layout as determined by the higher-magnification stepper. For example, when alignment marks of those shots, as denoted by double circles, are used a sufficiently wide alignment mark span can be defined and, additionally, the number of marks is not insufficient. As regards the alignment mark setting in this embodiment, the setting is not limited to the one shown in FIG. 9. It is only necessary that at least one mark is set in relation to one shot of the lower-magnification stepper.

Figure 12:
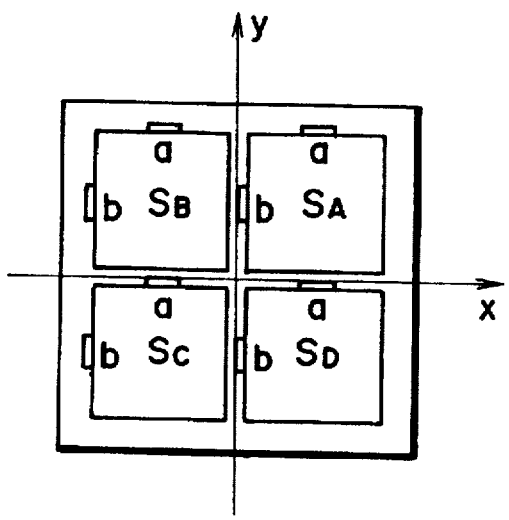
FIG. 12 is a plan view of a reticle according to an embodiment of the present invention.
Figure 13:
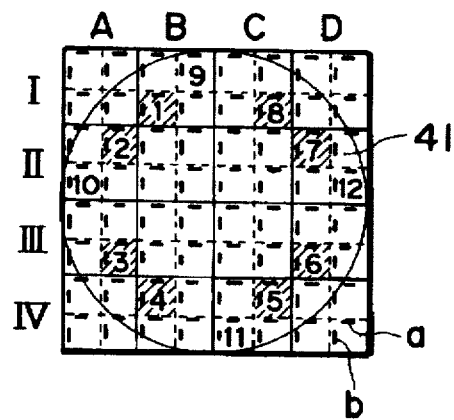
FIG. 13 is a schematic view for explaining the layout in a case where the reticle of FIG. 12 is used with a stepper for exposure of a wafer.

FIG. 12 is a plan view of a reticle according to an embodiment of the present invention, which is to be used in a lower-magnification stepper. As shown in the drawing, this reticle is provided with chip patterns $S_A$–$S_D$ and, in relation to each chip pattern, there are alignment marks a and b for X-direction measurement and Y-direction measurement, respectively. FIG. 13 is a plan view for explaining the layout and the disposition of the alignment marks a and b in a case where the above-described reticle is to be used with an exposure size of 50 mm square and with a wafer of 8-inch diameter.

In conventional global alignment process, only the alignment marks at four central shots can be used. In this embodiment, as shown in FIG. 13, it is possible to perform the measurement while using the alignment marks a and b of the chips 1–8 as sample shots (sample chips). Namely, the alignment mark selection in the shot can be done in the unit of chip. As a result, the number of sample shots (sample chips) can be four (4) to eight (8). Additionally, a longer alignment mark span can be defined. As regards the sample chip, while the chip pattern may be eclipsed in the outside peripheral portion of the wafer, if measurement is done to the alignment marks of the chips 9–12 in which the alignment marks a and b are exposed, it is possible to further extend the alignment mark span and, thus, to ensure further improvements in precision.

In the preceding embodiment, as shown in FIG. 13, the alignment marks and b at chips 1–8 are placed at different positions with respect to the shot center. For example, in shot B-I at column B and row I, the alignment marks a and b of the chip 1 are at lower left side of the center. In shot A-II, the alignment marks and b are at upper right side of the center. Thus, due to distortion of the exposure optical system (projection lens 103), for example, the alignment mark position a or b with respect to the shot center may be different in several shots. This is a factor of alignment error.

In this embodiment, the following correction is made to improve the alignment precision. That is, the amount of distortion of the exposure optical system is memorized in a table beforehand. Then, in regard to a mark position x as measured, the amount α (%) of the distortion corresponding to that position is read out of the table, and a correction amount αx is determined. In this manner, regardless of the alignment mark position within the shot, it is possible to calculate the shot center accurately and, therefore, to attain enhanced alignment precision.

Figure 14:
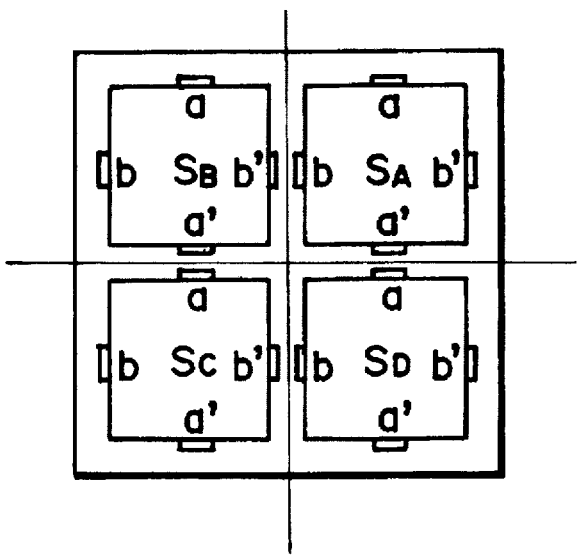
FIG. 14 is a plan view of a reticle according to another embodiment of the present invention.

FIG. 14 is a plan view of a reticle according to another embodiment of the present invention. When a step-and-repeat exposure process is to be done by using a stepper, generally there occurs an error in magnification (to be called "chip magnification error") due to the exposure optical system or rotation (to be called "chip rotation") due to an error in movement of a stage such as the wafer stage 107 of FIG. 18. These two error factors become particularly notable in a large-field exposure stepper. In this embodiment, in consideration thereof, as shown in FIG. 14 there are provided X-direction position detecting alignment marks a and a' and Y-direction position detecting alignment marks b and b', around chips $S_A$–$S_D$.

Figure 15:
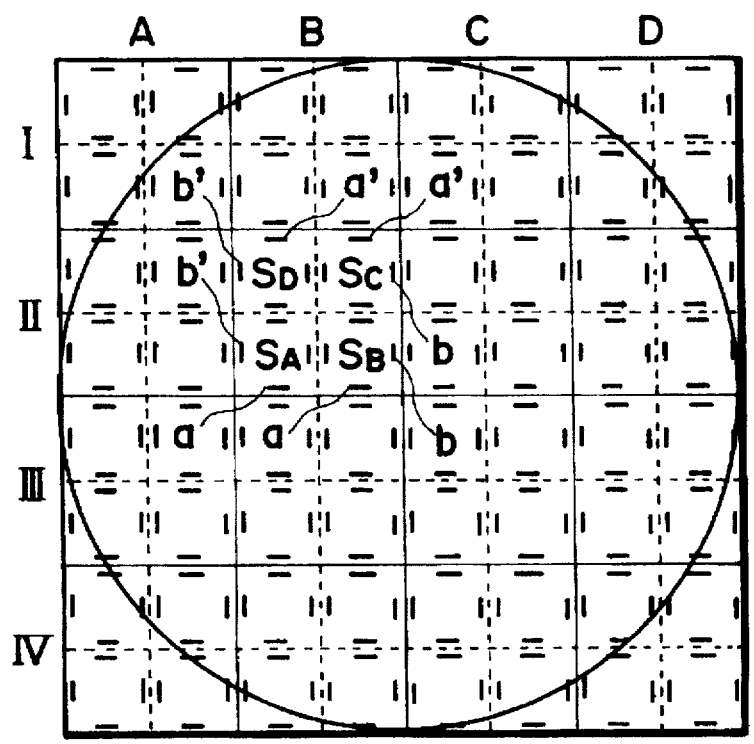
FIG. 15 is a schematic view for explaining the layout in a case where the reticle of FIG. 14 is used with a stepper for exposure of a wafer.

FIG. 15 is a plan view for explaining the layout in a case where an 8-inch wafer is exposed by using the above reticle. In regard to shot B-II, the positions of alignment marks of the chips $S_A$ and $S_B$ (or alignment marks a' of chips $S_C$ and $S_D$) as well as the positions of alignment marks b of the chips $S_B$ and $S_C$ (or alignment marks b' of the chips $S_A$ and $S_D$) are measured. Based on this, it is possible to calculate the chip magnification with respect to each of the X and Y directions. On the other hand, by measuring the positions of alignment marks b of the chip $S_A$ and alignment mark b of the chip $S_B$, it is possible to calculate the chip rotation.

The chip magnification error can be corrected by adjusting a portion of the exposure optical system 103. Also, the chip rotation can be corrected by rotating the wafer during the step-and-repeat motion of the wafer stage 107, in accordance with the calculation result. Thus, even in large-field exposure process, further enhancement of the alignment precision is assured.

Figure 16:
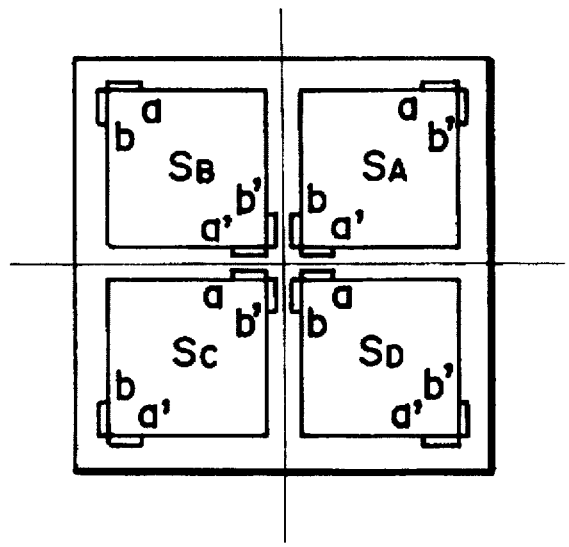
FIG. 16 is a plan view of a reticle according to a further embodiment of the present invention.
Figure 17:
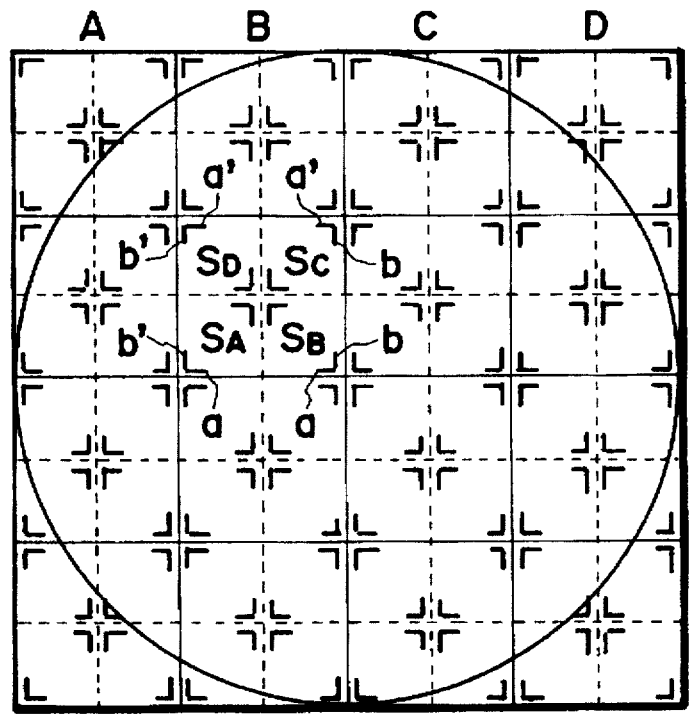
FIG. 17 is a schematic view for explaining the layout in a case where the reticle of FIG. 16 is used with a stepper for exposure of a wafer.

FIG. 16 is a plan view of a reticle according to a further embodiment of the present invention. FIG. 17 is a plan view for explaining exposure layout in a case where the exposure process is to be made by using the above reticle. In this example, alignment marks a, b, a' and b' are placed at corner portions of chip patterns, which are on diagonals of the exposure filed. The alignment mark span in the measurement of chip magnification or chip rotation is larger than that of the embodiment of FIG. 14. Also in this embodiment, correction of chip rotation or chip magnification is attainable through measurement using alignment marks a, b, a' and b', as has been described with reference to the FIG. 14 embodiment.

While the invention has been described with reference to the structures disclosed herein, it is not confined to the details set forth and this application is intended to cover such modifications or changes as may come within the purposes of the improvements or the scope of the following claims.

What is claimed is:

1. An alignment method, comprising the steps of:
   sequentially exposing different chip regions on a substrate by use of a first stepper having a high reduction magnification and having a shot region corresponding to at least one of the chip regions on the substrate, by which an alignment mark is defined on each chip region of the substrate; and
   performing a global alignment process with respect to the substrate by use of a second stepper having a lower reduction magnification than the first stepper and having a shot region corresponding to plural chip regions on the substrate;
   wherein the number of chip regions of the substrate corresponding to the shot region of the second stepper is larger than the number of chip region or regions of the substrate corresponding to the shot region of the first stepper;
   wherein, for the global alignment process, a plurality of sample regions are determined on the substrate, each sample region having a size corresponding to the shot region of the second stepper and having plural alignment marks each being formed therein according to said sequentially exposing step;
   wherein, for each sample region, among the plural alignment marks, particular alignment marks are selected for use in measurement;
   wherein each sample region includes first and second subordinate sample regions; and
   wherein the position of a selected particular alignment mark of the first subordinate sample region with respect to the center of the sample region differs from the position of a selected particular alignment mark of the second subordinate sample region with respect to the center of the sample region.

2. A method according to claim 1, wherein an offset is determined in accordance with the position of a selected particular alignment mark with respect to the center of the sample region, and wherein an alignment offset is reflected in the global alignment process in accordance with the number of positions of the selected particular alignment marks with respect to the respective sample region center.

3. An alignment method, comprising the steps of:
   sequentially exposing different chip regions on a substrate by use of a second stepper having a low reduction magnification and having a shot region corresponding to plural chip regions on the substrate, by which an alignment mark is defined on each chip region of the substrate; and
   performing a global alignment process with respect to the substrate by use of a first stepper having a higher reduction magnification than the second stepper and having a shot region corresponding to at least one chip region on the substrate;
   wherein the number of chip regions of the substrate corresponding to the shot region of the second stepper is larger than the number of chip region or regions of the substrate corresponding to the shot region of the first stepper;
   wherein, for the global alignment process, a plurality of sample regions are determined on the substrate, each sample region having a size corresponding to the shot region of the first stepper and having plural alignment marks each being formed therein according to said sequentially exposing step;
   wherein, for each sample region, among the plural alignment marks, particular alignment marks are selected for use in measurement;
   wherein each sample region includes first and second subordinate sample regions; and
   wherein the position of a selected particular alignment mark of the first subordinate sample region with respect to the center of the sample region differs from the position of a selected particular alignment mark of the second subordinate sample region with respect to the center of the sample region.

4. A method according to claim 3, wherein, in exposure regions on the substrate corresponding to the shot region of the second stepper, there are plural alignment marks formed by exposure of the substrate with the second stepper, in relation the chip regions of the substrate, wherein alignment marks in each exposure region include first and second alignment marks disposed symmetrically with respect to the center of that exposure region, and wherein the selected particular alignment marks being selected for use in measurement comprise second alignment marks of the same number as the first alignment marks.

5. A method according to claim 3, wherein an offset is determined in accordance with the position of a selected particular alignment mark with respect to the center of the sample region, and wherein an alignment offset is reflected in the global alignment process in accordance with the number of positions of the selected particular alignment marks with respect to the respective sample region centers.

6. A reticle for use in sequential exposure of exposure regions of a semiconductor substrate, comprising:

a plurality of chip patterns; and alignment mark forming patterns provided in association with the chip patterns, respectively, wherein each alignment mark forming pattern is disposed between juxtaposed chip patterns.

7. An exposure method for sequentially exposing exposure regions of a semiconductor substrate, said method comprising the steps of:

providing a reticle having a plurality of chip patterns and alignment mark forming patterns provided in association with the chip patterns, respectively, wherein each alignment mark forming pattern is disposed between juxtaposed chip patterns;

sequentially exposing the exposure regions of the substrate with the reticle, so that a plurality of chips and a plurality of alignment marks are defined on each exposure region of the substrate; and performing an alignment process with respect to the substrate for a subsequent exposure process, on the basis of those of the alignment marks formed by using the reticle on the substrate through said exposure step which are selected for use in measurement.

8. A method according to claim 7, further comprising the step of memorizing a measurement error due to the position of a selected alignment mark, selected for measurement, with respect to the center of the exposure region, and correcting a measured value related to the selected alignment mark, on the basis of the memorized error.

9. A method according to claim 7, further comprising the step of performing a global alignment process with respect to the substrate on the basis of a measured value related to the selected alignment marks.

10. An exposure method for sequentially exposing exposure regions of a semiconductor substrate, said method comprising the steps of:

providing a reticle having a plurality of chip patterns and alignment mark forming patterns provided in association with the chip patterns, respectively, wherein each alignment mark forming pattern is disposed between juxtaposed chip patterns;

sequentially exposing the exposure regions of the substrate of the reticle, so that a plurality of chips and a plurality of alignment marks are defined on each exposure region of the substrate; and determining at least one of a chip magnification error and chip rotation upon the substrate, on the basis of those of the alignment marks formed by using the reticle on the substrate through said exposure step which are selected for use in measurement.

* * * * *

UNITED STATES PATENT AND TRADEMARK OFFICE
CERTIFICATE OF CORRECTION

PATENT NO. : 5,695,897　　　　　　　　Page 1 of 2
DATED : December 9, 1997
INVENTOR(S) : NORIYUKI MITOME, ET AL.

It is certified that error appears in the above-identified patent and that said Letters Patent is hereby corrected as shown below:

COLUMN 1
    Line 14, "a" should read --to a--.
    Line 18, "of" (first occurrence), should be deleted.

COLUMN 3
    Line 13, "is" should read --is to--.

COLUMN 7
    Line 18, "108" should read --108.--.

COLUMN 8
    Line 7, "global" should read --the global--.
    Line 64, ""for" " should read --four --.

COLUMN 9
    Line 24, "used: That" should read --used, that--.

UNITED STATES PATENT AND TRADEMARK OFFICE
CERTIFICATE OF CORRECTION

PATENT NO. : 5,695,897
DATED : December 9, 1997
INVENTOR(S) : NORIYUKI MITOME, ET AL.

It is certified that error appears in the above-identified patent and that said Letters Patent is hereby corrected as shown below:

COLUMN 10

Line 7, "used" should read --used,--.
Line 25, "In" should read --In a--.
Line 31, "chip." should read --a chip.--.
Line 41, "and" should read --a and--.
Line 44, "at" should read --at the--.
Line 45, "and" should read --a and--.

Signed and Sealed this

Twenty-fifth Day of August, 1998

Attest:

BRUCE LEHMAN

Attesting Officer

Commissioner of Patents and Trademarks